United States Patent [19]

Klein

[11] 3,895,304

[45] July 15, 1975

[54] TUNABLE MICROWAVE NOTCH FILTER

[75] Inventor: Gerald I. Klein, Baltimore, Md.

[73] Assignee: Westinghouse Electric Corporation, Pittsburgh, Pa.

[22] Filed: Mar. 20, 1974

[21] Appl. No.: 452,863

[52] U.S. Cl................... 328/167; 333/73 W; 333/76

[51] Int. Cl....... H01p 1/20; H03k 5/12; H03h 7/14

[58] Field of Search....... 333/31 R, 73 R, 76, 73 W, 333/10, 11; 328/109, 167; 325/124, 164

[56] References Cited

UNITED STATES PATENTS 3,538,460 11/1970 Putz ..................................... 333/11

*Primary Examiner*—James W. Lawrence
*Assistant Examiner*—Marvin Nussbaum
*Attorney, Agent, or Firm*—R. M. Trepp

[57] ABSTRACT

A recursive microwave notch filter wherein each section is comprised of a pair of power dividers e.g. 3-db couplers joined by a short and a long microwave transmission line. Tuning of the frequency rejection notch is achieved by inserting an electrically controlled phase shifter having 360° of adjustment in the short transmission line. Two identical cascaded sections of the subject notch filter are required for coupling to the input of a saturated RF power amplifier, such as the output amplifier of an amplifier chain utilized in present day radar transmitters, in order to obtain the desired frequency rejection notch, due to the gain compression characteristic present in an amplifier when driven into its saturation region.

4 Claims, 13 Drawing Figures

TUNABLE MICROWAVE NOTCH FILTER

ACKNOWLEDGE OF GOVERNMENT CONTRACT

The invention herein described was made in the course of or under a contract with the Department of the Air Force.

BACKGROUND OF THE INVENTION

1. Field of the Invention

This invention relates to microwave filters and more particularly to the type of filter commonly referred to as a notch filter.

2. Description of the Prior Art

In microwave transmission, the rejection of undesired signals having frequencies differing from that of a desired signal has heretofore generally been attained by the use of multisection bandpass filters. As known in the art, a bandpass filter severely attenuates signals having frequencies residing outside the particular bandpass with the attenuation being a function of the difference between the center frequency of the band and the signal frequency. An alternative solution to the suppression of undesired signals has recently been to employ a band reject filter which is designed to reject all signals having frequencies within a particular band while passing all other frequencies. By selecting the reject band of the filter to include the undesired signal and exclude the desired signal, the attenuation of the desired signal is minimized while the required frequency rejection is attained.

Previous methods of providing a waveguide band reject filter have for example utilized a T-section waveguide in which one wall of the waveguide is broken and a stub is connected thereto. A bandpass filter, the pass band of which is equal to the band to be rejected is mounted in the stub to in effect pass the undesired signals through the stub. However, this method of utilizing a parallel resonant shunt for band rejection has been generally found unsatisfactory due to the lack of symmetry in the waveguide. More recently, a microwave band reject filter has been disclosed in U.S. Pat. No. 3,435,384, Renkowitz, wherein a four port directional coupler is provided with a bandpass filter and a quarter wave stub at one port and short circuiting end wall at another port such that the bandpass characteristic of the filter is in effect inverted to provide the required band rejection.

However, when transmitter time sharing in a complex multimode microwave system such as a frequency diversity pulse radar involves simultaneous reception of signals at more than one closely spaced frequency, it becomes necessary to shape the spectrum of the transmitted signal for predetermined spectral clarity to prevent mutual interference. For example, where such a radar initially transmits an RF pulse having a center carrier frequency $f_1$, the side lobe energy associated with the power spectrum of this pulse may overlap the center frequency $f_2$ of the next following RF pulse. Such interaction is highly undesirable. It then becomes imperative to filter selected side lobe components during transmission of each radar pulse so that interference with the subsequent RF pulse will be prevented. The use of present state of the art bandpass and band reject filter apparatus however does not provide useful results where it is desired to provide spectral shaping in the output of a power output amplifier in a RF amplifier chain, particularly for frequency spacings of a few percent or less due to energy storage and the decay properties of high Q filter elements. Such filters in the high power transmit line, moreover, add energy loss and suffer from all the common thermal and voltage breakdown problems of high power components.

SUMMARY

Briefly, the subject invention is directed to a recursive microwave notch filter basically consisting of two 3-db four port directional couplers coupled together by a short and a long microwave transmission line of predetermined fixed lengths. The attenuation between the input and output of each filter section varies with frequency, going from a maximum to a minimum when the change in phase shift between the long and short transmission line conduction path length is equal to 180°. Accordingly, although the frequency difference between the minimum and maximum loss is fixed by the difference in path lengths, the frequency rejection is capable of being varied by including a variable microwave phase shifter having 360° of adjustment in the short transmission line to tune the notch to a desired frequency. A dual section filter comprised of two sections of the subject filter connected in series in particularly adapted to be coupled into the amplifier chain of an RF transmitter having a saturated amplifier characteristic. The two filter sections thus combined produces double steps on the leading and trailing edges of the output pulse in the time domain which after passing through the saturated amplifier, has the first pair of steps removed which while reducing the notch to that of a single filter in the output of the amplifier nevertheless exhibits in the frequency domain the desired notch rejection characteristic.

DESCRIPTION OF THE PREFERRED EMBODIMENTS

Figure 1:
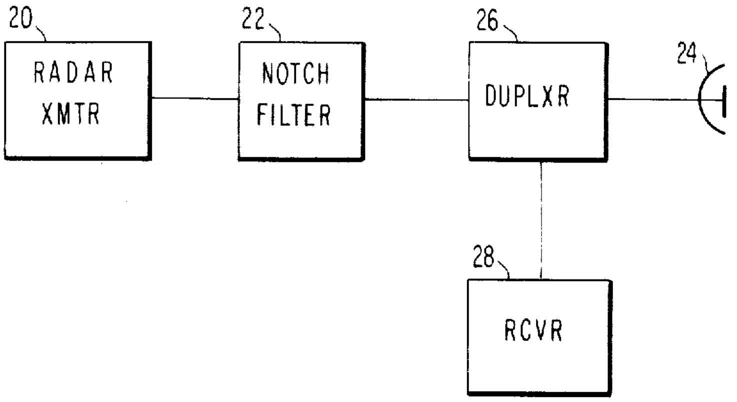
FIG. 1 is a block diagram illustrative of a first configuration of a pulse radar apparatus utilizing a microwave notch filter.
Figures 2A, 2B:
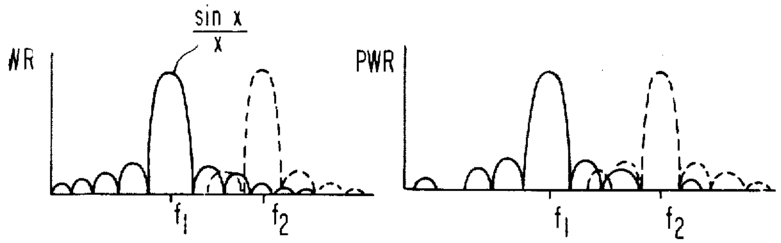
FIG. 2A is a waveform illustrative of the problem encountered with respect to the RF spectrum of a frequency diversity pulse radar system.
FIG. 2B is a waveform illustrative of the RF spectrum of a frequency diversity pulse radar system utilizing the subject invention to achieve spectral shaping.

In order to more fully understand and appreciate the utility of the subject invention, reference is first made to FIG. 1 wherein reference numeral 20 denotes a pulse radar transmitter and more particularly a transmitter generating RF pulses which are successively changed in carrier frequency over a predetermined time interval. Each RF pulse typically defines a sin $x/x$ power spectrum such as shown in FIG. 2A. Where, however, adjacent radar pulses are transmitted relatively close in frequency, it can be seen that it is possible for the center frequency $f_2$ to be located coincident with one of the side bands of the previous pulse $f_1$. Accordingly, the energy present in the side bands of $f_1$ acts to degrade the spectral purity of the pulse $f_2$ resulting in smearing of the return signals when detected. The present invention thus has for its object the shaping of the spectrum of the transmitted signals to overcome this interference problem. Accordingly, by including a notch filter having a frequency reject characteristic whose notch appears at $f_2$ during the transmission of the pulse $f_1$, the side band appearing at $f_2$ will be attenuated as shown in FIG. 2B. Now upon the subsequent transmission of the pulse $f_2$, smearing of the return will not be effected by the side band energy since it was previously attenuated. Thus by shaping the RF drive for each frequency pulse coupled to the antenna 24 through the duplexer 26, the received radar returns coupled back to the receiver 28 will be enhanced due to the reduction of predetermined side bands from previously transmitted radar pulses.

Figure 3:
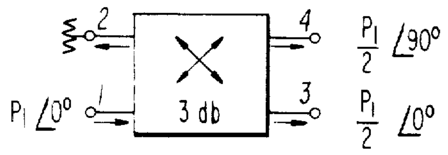
FIG. 3 is a block diagram illustrative of the operation of a four port short-slot hybrid 3—db directional coupler comprising one element of the subject invention.

The present invention is directed to a microwave notch filter particularly adapted but not limited for use in radar apparatus for shaping the spectrum of the RF pulses to be transmitted as indicated in FIG. 2. Basically, the subject invention is comprised of two microwave directional couplers 30 and 32 preferably but not restricted to a pair of "short-slot" hybrid couplers commonly referred to as "3-db couplers." Such couplers in effect become power dividers or splitters as are well known to those skilled in the art, being taught for example in the text entitled *Electronic Designer's Handbook*, Mc-Graw-Hill, 1957, at pages 20–54. Referring briefly to FIG. 3, such a coupler comprises a four port device wherein for example input power $P_1$ applied to port 1 will be substantially evenly divided between output ports 3 and 4. Because such a device is not a perfect device, a small amount of power will nevertheless be directed to port 2 which typically has a suitable microwave termination connected thereto.

Figure 4:
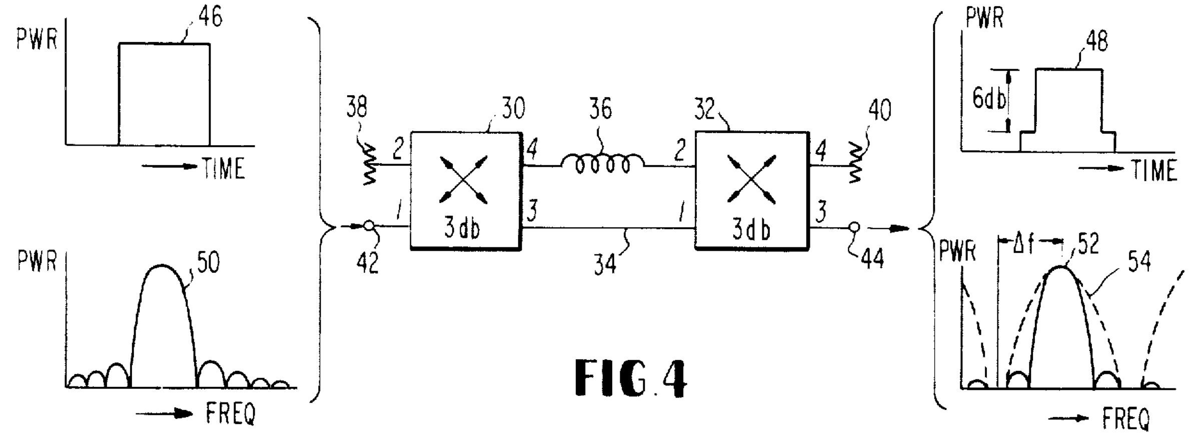
FIG. 4 is a block diagram illustrative of the basic embodiment of the subject invention.

Referring now to the embodiment shown in FIG. 4, each filter section additionally includes a shor transmission line 34 of a first fixed conduction path length and a long transmission line 36 of a second fixed conduction path length respectively joining selected parts of the two 3-db couplers 30 and 32. More particularly, the RF input is adapted to be applied to port 1 of 3-db coupler 30 while the two output ports 3 and 4 thereof are respectively connected to one end of the short transmission line 34 and the long transmission line 36. Port 2 of coupler 30 is terminated in a microwave termination 38. The opposite ends of the two transmission lines 34 and 36 are respectively coupled to input ports 1 and 2 of the 3-db coupler 32 whereupon the output power is taken from port 3 while port number 4 is terminated in a microwave termination 40. Due to the difference in path length of the transmission lines 34 and 36 during the time required for energy to propagate through path 36, the combination of the two 3-db power dividers produces an RF attenuation between input terminal 42 and output terminal 44 of 6-db. Accordingly, if an RF pulse 46 shown in the time domain in FIG. 4 is applied to the input terminal 42, an output pulse will appear at terminal 44 as indicated by reference numeral 48. The output pulse 48, moreover, will have a 6-db step on the leading and trailing edge of the pulse which is caused by the difference in path lengths between the short and long transmission lines 34 and 36. In the frequency domain the input pulse appears as the waveform 50 in FIG. 4. However, the output pulse in the frequency domain as shown by reference numeral 52 has attenuated side bands at a specific frequency spacing on either side of the center frequency. This results from the recursive notch filter characteristic provided by the filter section as shown from the curve 54.

Figure 5:
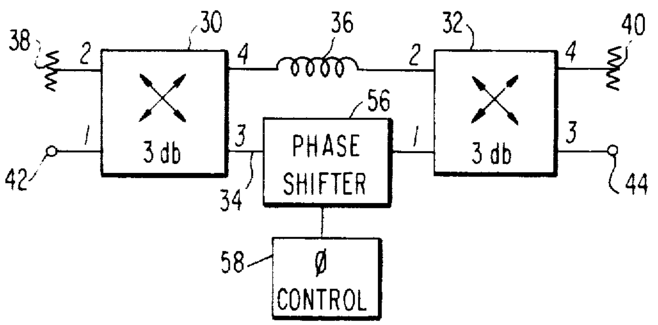
FIG. 5 is a modification of the embodiment shown in FIG. 4 having means for tuning the frequency of the rejection notch.
Figure 6:
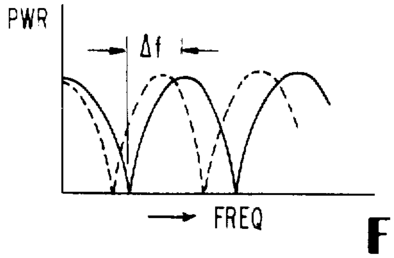
FIG. 6 is a power transmission vs. frequency diagram illustrating the tuning characteristic of the embodiment shown in FIG. 5.

The attenuation, moreover, between terminals 42 and 44 is a function of frequency, going from maximum to minimum when the change in phase shift between the long and short transmission lines 36 and 34 is equal to 180°. This can be expressed by the following relationship:

$$f_{max} - f_{min} = \Delta f = \frac{1.5 \times 10^4}{\Delta L}$$

where $\Delta L$ is the difference in path length in centimeters for an air dielectric TEM line. The signal that does not couple from terminal 42 to terminal 44 is delivered to a termination 40. Thus for a $\Delta L$ of 1000 centimeters, $\Delta f$ is 15MHz. In other words 30MHz exists between notches. Since the distance between notches is a function of the 180° phase cross over points tuning of the filter i.e. location of the notches, can be obtained by the insertion of a controlled 360° variable microwave phase shifter 56 commonly referred to as a "phaser" coupled into the short transmission line 34 as shown in FIG. 5. By additionally providing suitable control circuitry 58 for controlling the phase shifter 56, a characteristic such as shown in FIG. 6 can be provided. A typical example of a controlled microwave phase shifter comprises the ferrite phase shifter disclosed in the Proceedings of The G-MTT, 1970 International Microwave Symposium, May 11–14, 1970, pages 337–340, inclusive, entitled "A Dual Mode Latching, Reciprocal Ferrite Phase Shifter" by Charles R. Boyd, Jr. The phase shifter 56 acts as an added length of transmission line whose length is electronically variable over 360°. This causes a second order variation in Δf between notches, e.g. at S band 360° ≈ 10 centimeters. For a $\Delta L$ = 1000Cm., as the phase is varied 360°, the $\Delta f$ between notches is changed by 1 percent or 0.3MHz.

Whereas the position in the frequency domain of the notches for the filter section shown in FIG. 4 is fixed, the configuration shown in FIG. 5 is particularly adapted to be utilized in connection with a radar transmitter shown in FIG. 1 wherein the phase control circuitry 58 can be operated in conjunction with the circuitry for controlling the frequency of radar transmitter 20 so that by selectively controlling the phase shifter 56, tuning of the notch filter can be maintained in timed relationship with the carrier frequencies of the pulses transmitted to provide the required spectral clarity essential for proper operation of a frequency hopping radar system.

Figure 7:
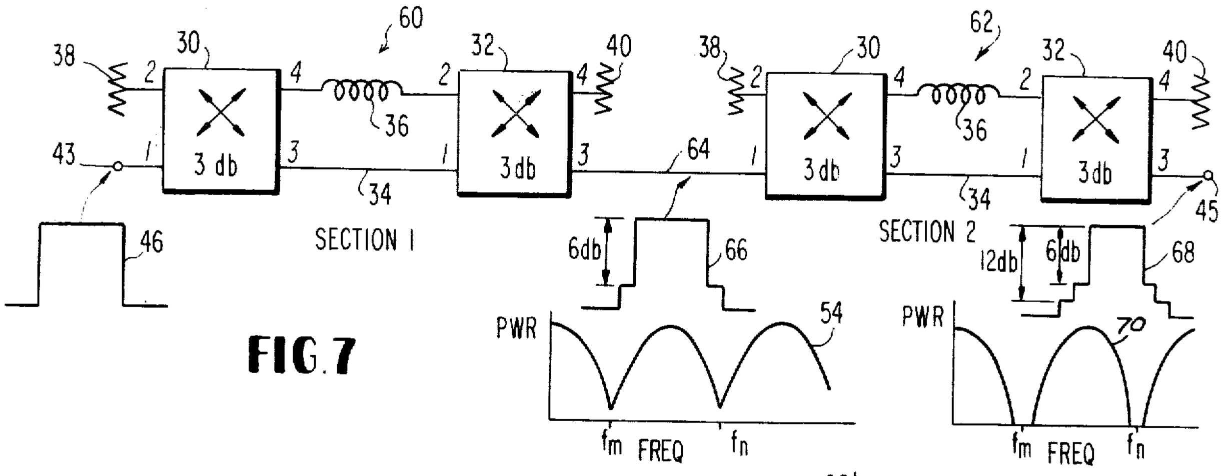
FIG. 7 is yet another embodiment of the subject invention comprised of a two section filter particularly adapted to be utilized in a pulse radar transmitter consisting of a chain of RF amplifiers.

Referring now to FIG. 7, a two section notch filter is next disclosed which is comprised of two identical filter sections 60 and 62 connected in series such that output port 3 of coupler 32 of the first section 60 is directly connected to input port 1 of coupler 30 of the second section 62. An input terminal 43 is coupled to port 1 of the coupler 30 of the first section 60 while an output terminal 45 is now connected to port 3 of coupler 32 of the second section 62. The series connection between filter sections 60 and 62 is made by way of any suitable microwave transmission line 64. When an RF pulse such as referred to above by reference numeral 46 is applied to input terminal 43 it appears at the output of filter section 60 on transmission line 64 as a pulse 66 in the time domain having a 6–db step in the same manner as described with reference to the embodiment shown in FIG. 4. As noted, the step on the leading and trailing edge is caused by the time delay of the energy propagated through the long transmission line 36 from port 4 of coupler 30 to port 2 of coupler 32 which then couples the signal to port 3. In the embodiment shown in FIG. 7, the RF pulse 66 having the 6-db step is now applied as an input to port 1 of the coupler 30 of the second section 62. The signal pulse 66 is split and propagated through the short and long transmission lines 34 and 36 of the second section 62 where due to the difference in travel times causes the second coupler 32 to recombine the signals into an output pulse 68 having two steps in the time domain on the leading and trailing edges. The 6–db step in the waveform 66 now comprises a 12–db step in the output while the second portion of leading edge of pulse 66 generates the 6–db step as in the output waveform 68. In the frequency domain, the output from the first stage 60 of the two stage filter as shown in FIG. 7 produces a recursive attenuation characteristic as shown by curve 54; however, the second section of the filter 62 functions to provide still greater attenuation at the same notch frequencies in the frequency domain as shown by waveform 70.

As in the case of the single section notch filter, the dual section filter is also adapted to be frequency tuned by the addition of respective microwave phase shifters 56 coupled into the respective short transmission lines 34 in both sections 60 and 62 of the filter. By the use, for example, of ferrite electrically controlled phase shifters, the phase shift can be selectively controlled by means of driver and control logic circuitry 72.

Figure 9:
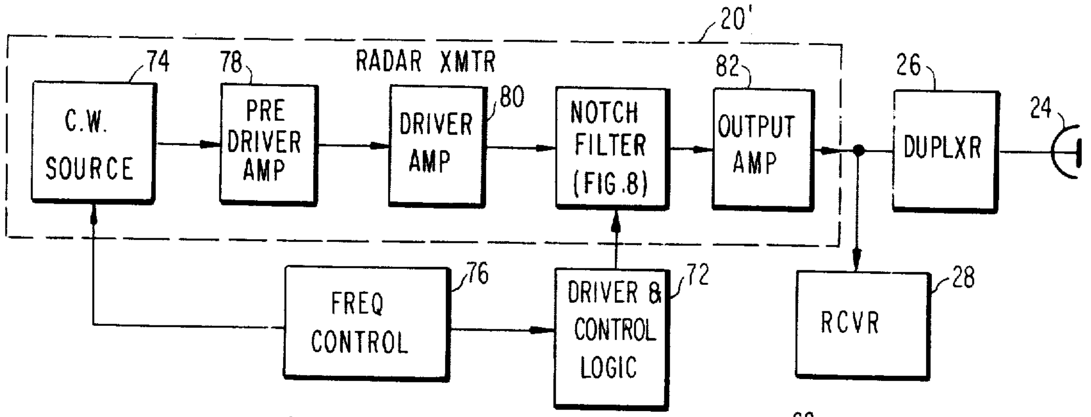
FIG. 9 is a block diagram typically illustrative of a frequency diversity pulse radar transmitter comprised of an RF amplifier chain and including the embodiment of the filter shown in FIG. 8.
Figure 8:
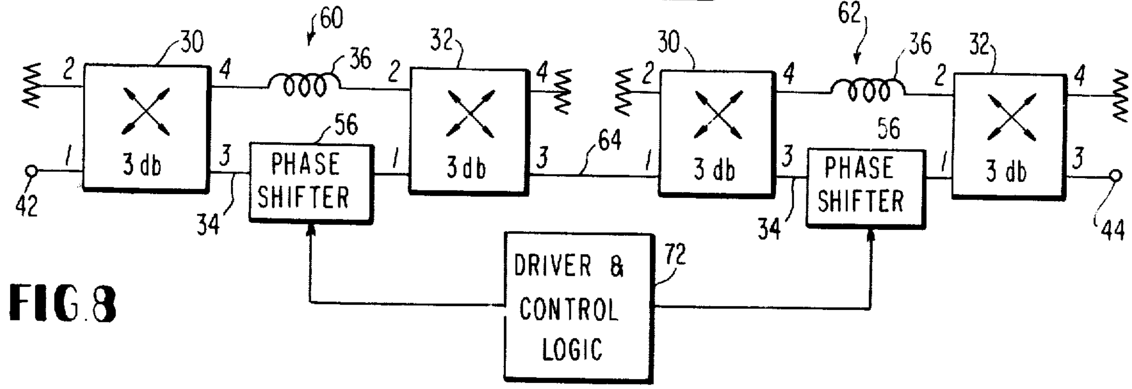
FIG. 8 is a block diagram illustrative of a tunable embodiment of the cascaded notch filter shown in FIG. 7.
Figure 10:
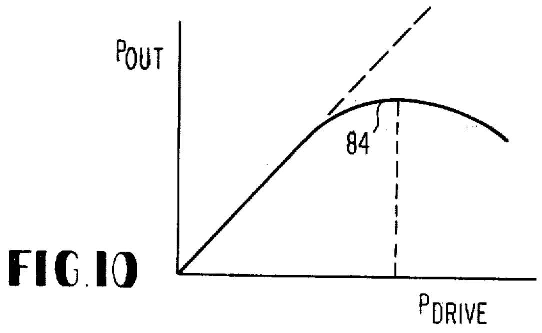
FIG. 10 is a graph illustrating the power transfer characteristic of a typical RF power amplifier.
Figure 11A:
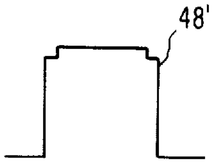
FIG. 11A is a time domain waveform illustrative of the output obtained with a single section notch filter such as shown in FIGS. 4 and 5 being utilized in the radar transmitter shown in FIG. 9.
Figure 11B:
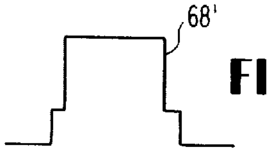
FIG. 11B is a time domain waveform illustrative of the output obtained with a notch filter configuration shown in FIGS. 7 and 8, when utilized in combination with the radar transmitter as shown in FIG. 9.

A single section notch filter coupled to the output of the radar transmitter such as shown in FIG. 1 although operable, has inherent limitations due to the necessity of being comprised of high power components. Secondly, present day radar apparatus has moved away from the use of pulsed magnetrons and the like in applications where frequency hopping is desired. The preference is to have the radar transmitter comprised of an amplifier chain such as shown in FIG. 9. Referring now to FIG. 9, reference numeral 20' designates a multifrequency pulse radar transmitter comprised of a CW source 74 controlled by an external frequency control circuit 76 receiving command inputs from a system control circuit, not shown. The CW output is coupled typically through two intermediate RF amplifier stages 78 and 80 and then applied to an RF high power output amplifier 82. In such a configuration, it was found that it would be preferable if spectral shaping of the RF pulses could be attained prior to the output amplifier 82. Accordingly, a microwave notch filter according to the subject invention was introduced into the amplifier chain between the driver amplifier 80 and the output amplifier 82. It is the general practice that such high power output amplifiers are operated in the saturation region 84 of the power transfer characteristic, an example of which is shown for sake of illustration in FIG. 10, in order to obtain high efficiency. It was observed, however, that a single section microwave filter such as shown in FIG. 5 did not produce the desired results due to the fact that the gain compression produced in saturation region 84 of the output amplifier 82 removes a substantial part of the step appearing in the time domain waveform 48 shown in FIG. 4 with a resulting output waveform 48' shown in FIG. 11A. The corresponding effect of the gain compression in the output amplifier 82 is that a loss of the desired notches in the frequency domain occurs. However, by the inclusion of a two stage notch filter such as shown in FIG. 7 and more particularly FIG. 8 wherein the time domain waveform 68 is fed to the output amplifier 82, the first step is reduced as before, however the second step causes a waveform 68' to be provided as an output which substantially corresponds to the time domain waveform 48 for a single section filter. Accordingly, the required frequency domain notches are present in the output of the amplifier 82 with a two section filter as desired yielding what might be referred to as a "sacrificial notch filter" output.

It should be observed that whereas frequency tuning is desirable for a multifrequency system since the notch frequencies are different for each successive RF pulse frequency, a plurality of notch filters each tuned to a specific frequency could be utilized where they are arranged in a parallel array in the proper order with successive coupling by suitable switching techniques well known to those skilled in the art. While this type of arrangement results in the desired spectral shaping, the use of a single notch filter with selective frequency control by the utilization of microwave phase shifters in the short transmission line provides a substantial improvement in size, weight and cost, as well as losses. Although a specific type of microwave phase shifter was referred to above, any form of microwave phase shifter providing 360° adjustment can be used to tune the notch to all possible frequencies. The type selected is dependent upon the specifics of peak and average RF power, switching speeds encountered, the frequency setting resolution and stability, allowable power loss, size, weight, and control power. Accordingly, in addition to digital and analog latching ferrite phasers, a multibit digital diode phaser as well as various forms of coil driven analog ferrite phasers may be utilized when desired.

Although the short slot hybrid coupler was shown for purposes of explanation and illustration it should be observed that when desirable any type of four port 3-db power divider can be utilized such as a magic tee, stripline overlay coupler or a coaxial branching line coupler. The important thing is isolation between the output ports and a terminated fourth port. Since it is possible to use a single filter having a tuning capability to tune the notch to all possible frequencies, the electronic tuning feature therefore expands the capability of the notch filter to handling a large number of frequencies in a single system.

While there has been shown and described what is at present considered to be the preferred embodiments of the invention, modifications thereto will readily occur to those skilled in the art. Therefore, it is not desired that the invention be limited to the specific arrangements shown and described, but it is to be understood that all equivalents, alterations and modifications coming within the spirit and scope of the present invention as defined by the claims are herein meant to be included.

I claim as my invention:

1. A microwave notch filter, comprising at least one filter section including:

a first and second microwave four port signal power splitter each having a pair of input ports and a pair of output ports;

means coupled to one input port of said first power splitter for coupling a microwave signal thereto;

a first transmission line having a selected signal path length coupled between one output port of said first power splitter and one input port of said second power splitter;

a second transmission line, having a signal path length of a predetermined length longer than said first transmission line, coupled between the other output port of said first power splitter and the other input port of said second power splitter whereby an output signal is provided at one output port of said second power splitter, said output signal having a waveform which includes a step in the time domain and a recursive frequency attenuation notch in the frequency domain;

termination means respectively coupled to the other input port of said first power splitter and the other output port of said second power splitter;

means coupled to said other output port of said second power splitter for coupling said output therefrom, additionally including a second filter section coupled in series to said at least one filter section wherein said second section comprises:

third and fourth microwave signal power splitters each having a pair of input ports and a pair of output ports;

said one input port of said third power splitter being coupled to said means coupled to said other output port of said second power splitter;

a third transmission line having a selected signal path length coupled between one output port of said third power splitter and one input port of said fourth power splitter;

a fourth transmission line having a single path length relatively longer than the signal path length of said third transmission line, coupled between the other output port of said third power splitter and the other input port of said fourth power splitter;

termination means respectively coupled to the other input port of said third power splitter and one output port of fourth power splitter;

output signal means coupled to the other output port of said fourth power splitter; and additionally including a power amplifier operated in the saturation region of its power transfer characteristic and having an input coupled to said output signal means whereby the gain compression of said amplifier provided by the operation thereof in said saturation region effectively removes one step in the time domain and reduces the recursive frequency attenuation notch to that of a single filter section at the output of said amplifier.

2. The filter as defined by claim 1 wherein said output amplifier comprises the output power amplifier of an RF amplifier chain in a radar transmitter including a diverse frequency pulse source.

3. The filter as defined by claim 2 and additionally including first and second electrically controlled phase shifter means coupled in series with said first and third transmission lines, and additionally including control means for varying the phase shift characteristics of said phase shifter in time relationship with the operating frequency of said diverse frequency pulse source.

4. The filter as defined by claim 3 wherein all of said power splitters are each comprised of four port, 3-db directional couplers.

* * * * *